United States Patent [19]
Miyashita et al.

[11] Patent Number: 5,434,447
[45] Date of Patent: Jul. 18, 1995

[54] SEMICONDUCTOR DEVICE HAVING A TRENCH FOR DEVICE ISOLATION AND METHOD OF FABRICATING THE SAME

[75] Inventors: Naoto Miyashita, Yokohama; Koichi Takahashi, Kawasaki, both of Japan

[73] Assignee: Kabushiki Kaisha Toshiba, Kawasaki, Japan

[21] Appl. No.: 250,110

[22] Filed: May 26, 1994

Related U.S. Application Data

[63] Continuation of Ser. No. 92,562, Jul. 16, 1993, abandoned, which is a continuation of Ser. No. 705,499, May 24, 1991, abandoned.

[30] Foreign Application Priority Data

May 28, 1990 [JP] Japan ................... 2-135374
May 28, 1990 [JP] Japan ................... 2-135375

[51] Int. Cl.⁶ ............................................. H01L 29/06
[52] U.S. Cl. ................................. 257/514; 257/517; 257/519; 257/622
[58] Field of Search ..................... 357/236, 52, 55; 257/510, 513, 514, 519, 622

[56] References Cited

U.S. PATENT DOCUMENTS 5,100,822 3/1992 Mitani ..................... 357/23.6

OTHER PUBLICATIONS

Y. Tamaki et al., Evaluation of Dislocation Generation in U-Groove Isolation, Journal of the Electrochemical Society, vol. 135, No. 3, Mar. 1988, pp. 726-730.
A. Hayasaka et al., U-Groove Isolation Technique for High Speed Bipolar VLSI's, IEDM, 1982.
L. O. Wilson, Oxidation of Curved Silicon Surfaces, Journal of the Electrochemical Society, vol. 134, No. 2, pp. 481-490, Feb. 1987.
K. Imai et al., Decrease in Trenched Surface Oxide Leakage Currents By Rounding Off Oxidation, Japanese Journal of Applied Physics, Supplements 18th Conference on Solid State Devices, pp. 303-306, 1986.

*Primary Examiner*—Edward Wojciechowicz
*Attorney, Agent, or Firm*—Finnegan, Henderson, Farabow, Garrett & Dunner

[57] ABSTRACT

A device-isolating trench having a taper at its upper portion is formed in a silicon semiconductor substrate. Then, a silicon oxide film is formed on the inner wall of the trench and the surface of the semiconductor substrate near the trench by an oxidizing method, and polycrystalline silicon is buried in the trench.

5 Claims, 9 Drawing Sheets

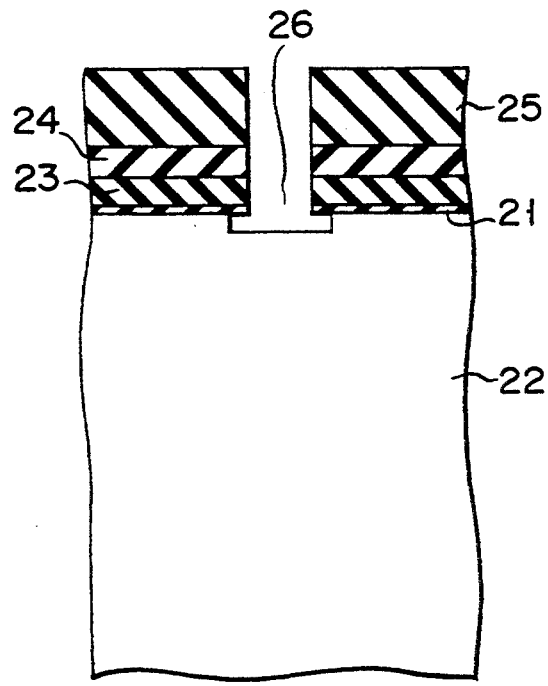
F I G. 2A
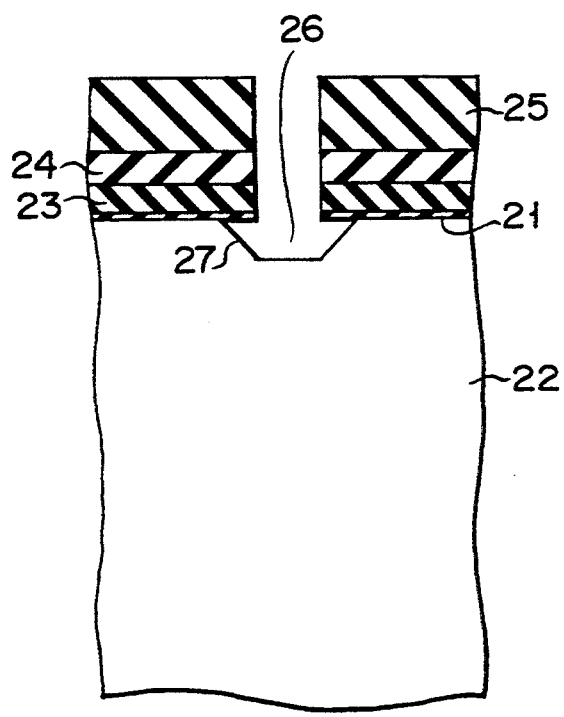
F I G. 2B

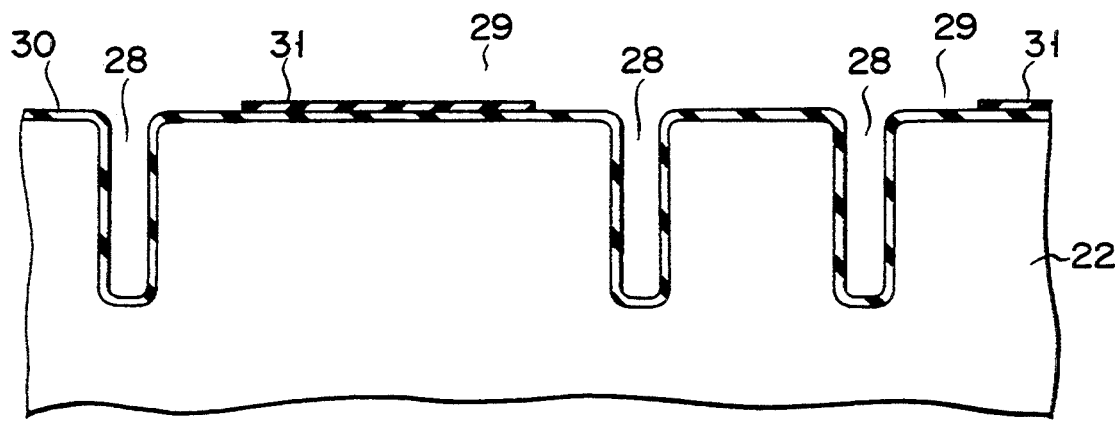
F I G. 2E
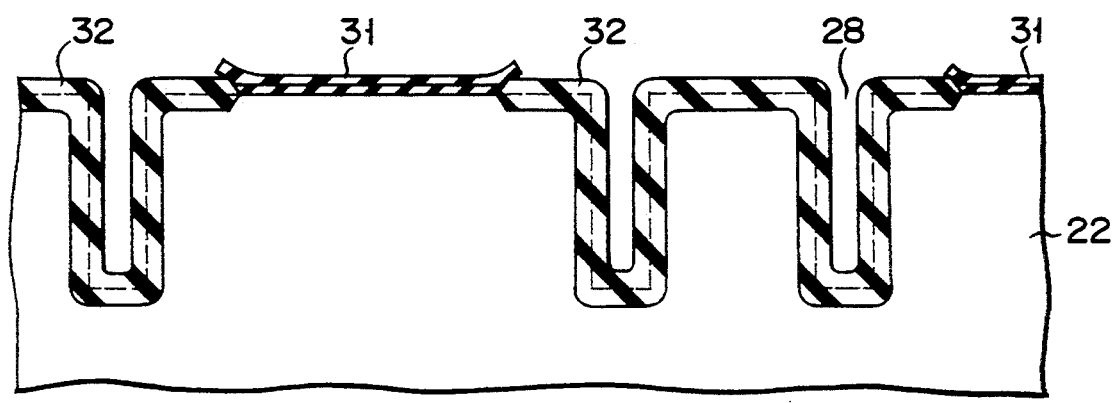
F I G. 2F

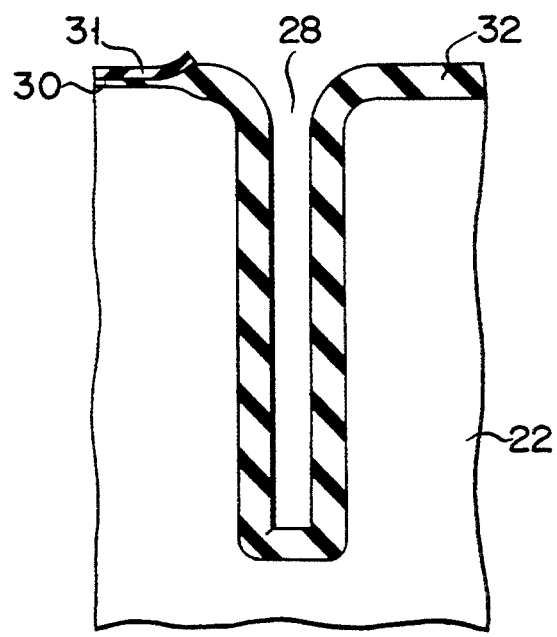
F I G. 2G
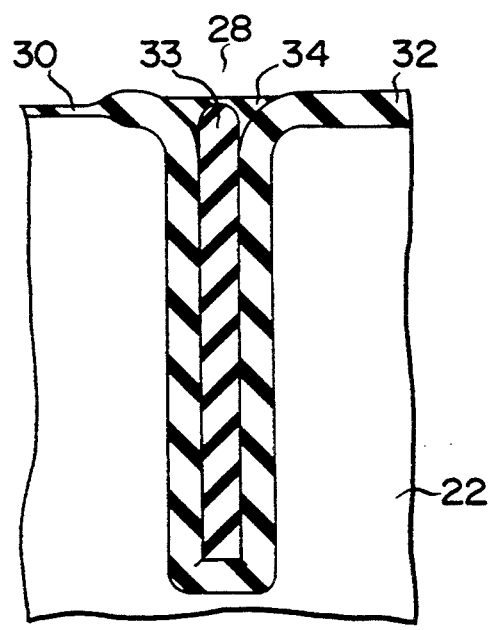
F I G. 2H

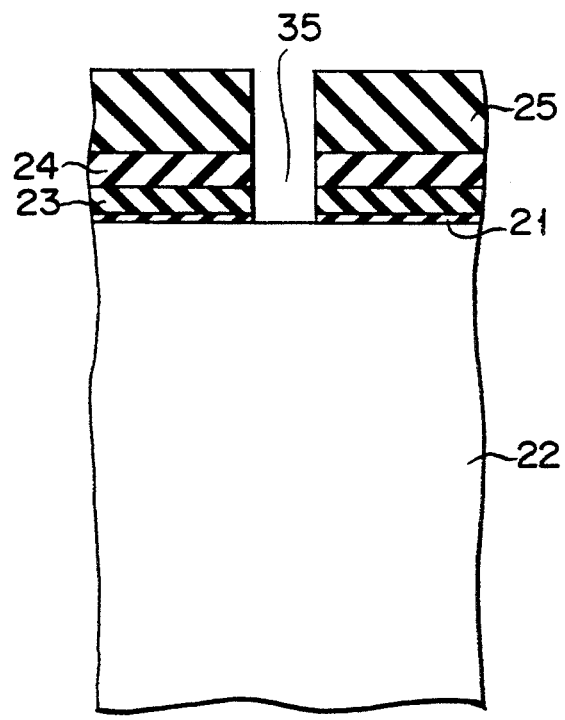
F I G. 4A
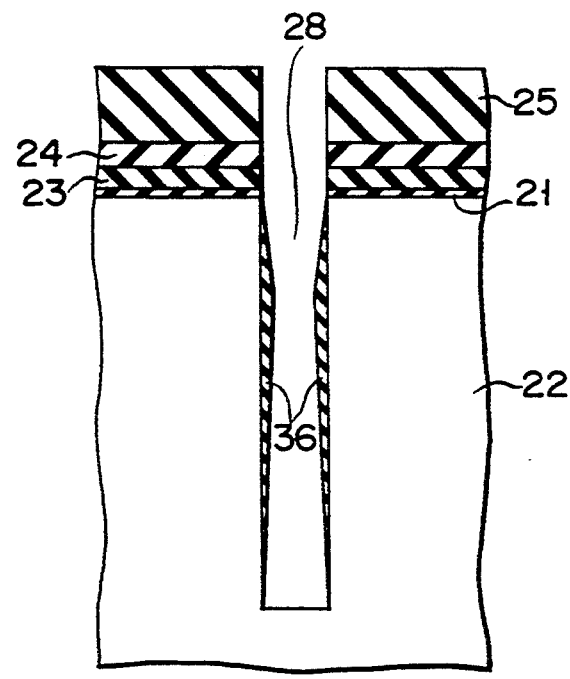
F I G. 4B

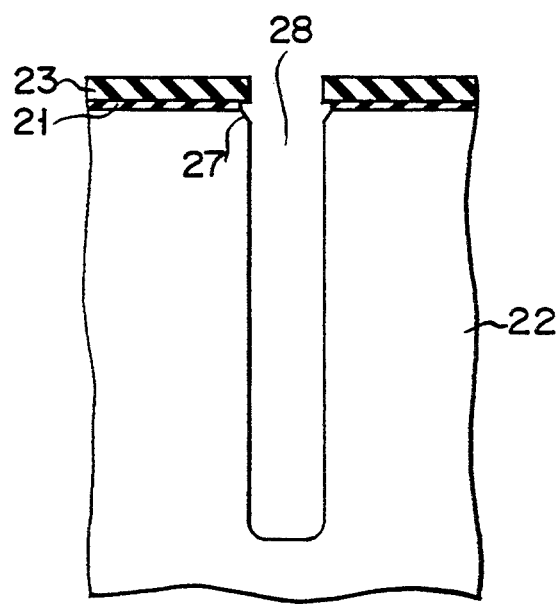
F I G. 4C
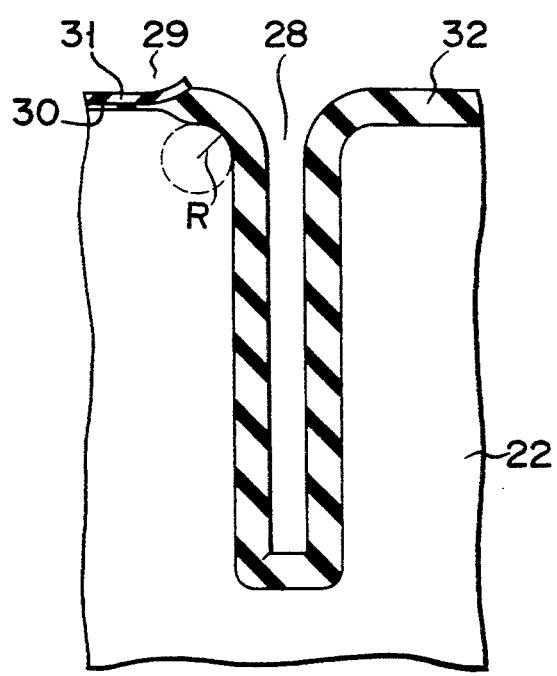
F I G. 4D

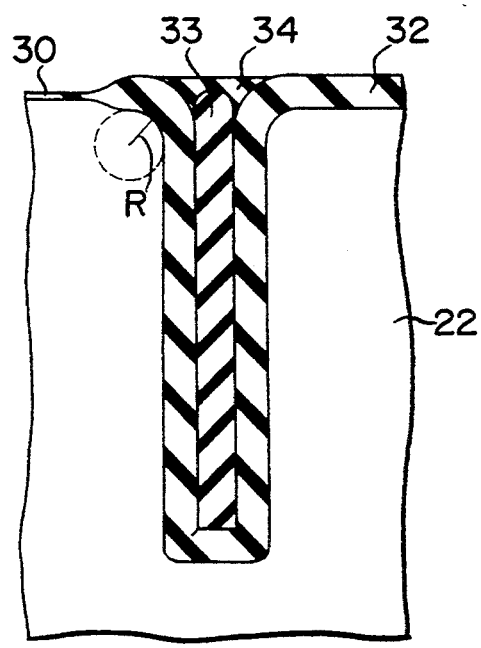
F I G. 4E
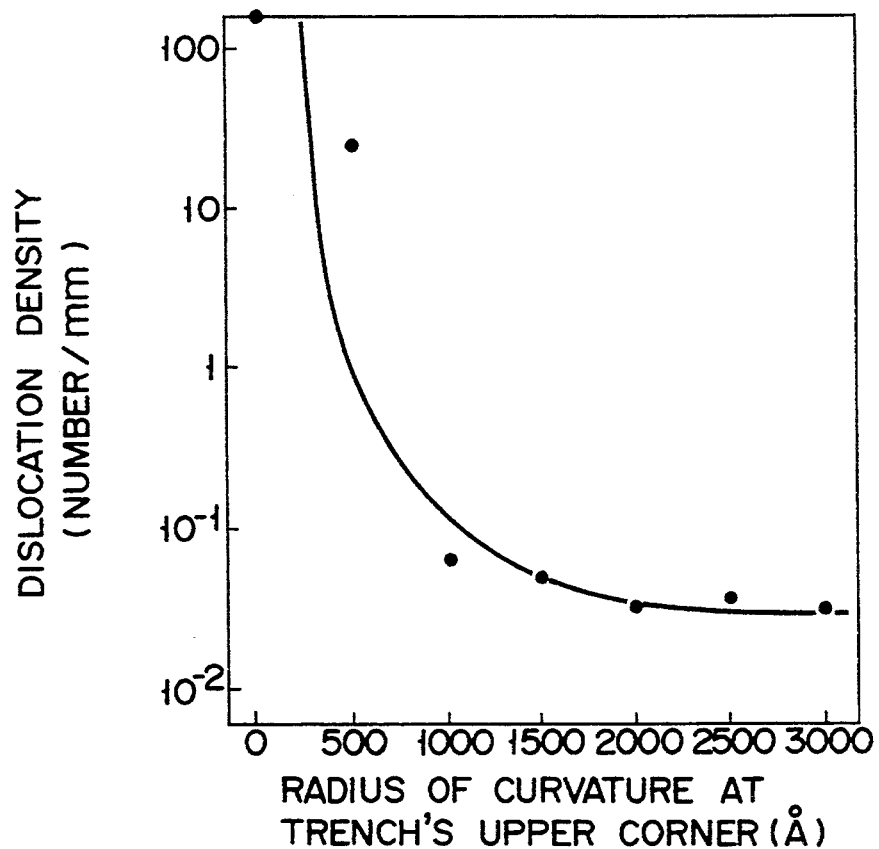
F I G. 5

SEMICONDUCTOR DEVICE HAVING A TRENCH FOR DEVICE ISOLATION AND METHOD OF FABRICATING THE SAME

This application is a continuation of application Ser. No. 08/092,562 filed Jul. 16, 1993, now abandoned, which is a continuation of Ser. No. 07/705,499, filed May 24, 1991, now abandoned.

BACKGROUND OF THE INVENTION

1. Field of the Invention

The present invention relates to a semiconductor device in which device isolation is made by a trench formed in a semiconductor substrate, and a method of fabricating the same.

2. Description of the Related Art

Conventionally, device isolation using such a trench is carried out in the following manner.

As shown in FIG. 1A, a trench 11 is formed in a semiconductor substrate 12, and a thin oxide film 13 is formed on the inner wall of the trench 11. A nonoxide film 14 is then formed only on a device region 15.

Then, with the nonoxide film 14 used as a mask, the resultant structure is subjected to an oxidization treatment to form a thick oxide film 16 on the surface of the device region 15 except on a part thereof, as shown in FIG. 1B.

Thereafter, polycrystalline silicon is buried in the trench 11 where the oxide film 16 is formed, followed by flattening of the top surface of the polycrystalline silicon, deposition of a cap oxide film, and so forth, thereby providing the device isolation.

According to this conventional method, the wall of the trench 11 and the surface of the substrate 12 define almost right angles at an upper corner portion 17 of the trench 11, as shown in FIG. 1B. At the time the thick oxide film 16 is formed, therefore, thermal stress is concentrated on the corner portion 17 at the oxidization time, and so is stress originated from expansion of volume or the like. This causes dislocation in the oxide film 16 near the corner portion.

This dislocation impairs the device isolation characteristic and the characteristic of a device formed in the device region. For instance, if bipolar transistors are respectively formed in multiple device regions, the dislocation results in an increase in leak current between the collectors of the individual transistors and deterioration of the current amplification factor. In other words, since the presence of dislocation to a certain degree increases the recombination current, the device characteristic and the device isolation characteristic are deteriorated.

SUMMARY OF THE INVENTION

It is therefore an object of the present invention to provide a semiconductor device, which can suppress the occurrence of dislocation in an oxide film at the upper corner portion of a trench for device isolation and can thus improve the characteristic of a device formed in a device region as well as the device isolation characteristic, and a method of fabricating the same.

According to one aspect of the present invention, there is provided a method of fabricating a semiconductor device, which comprises a first step of forming a device-isolating trench with a taper at an upper portion thereof, in a semiconductor substrate; and a second step of forming an oxide film on an inner wall of the trench and a surface of the semiconductor substrate near the trench by an oxidizing method.

According to another aspect of the present invention, there is provided a semiconductor device comprising a semiconductor substrate; a device-isolating trench formed in the semiconductor substrate; and an insulating film so formed as to cover an inner wall of the trench and a surface of the semiconductor substrate near the trench, with a radius of curvature of 0.1 $\mu$m or greater at an upper corner portion of the trench.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2H are cross-sectional views of individual steps of a conventional method of fabricating a semiconductor device according to the first embodiment of the present invention;

FIGS. 4A to 4E are cross-sectional views of individual steps of a conventional method of fabricating a semiconductor device according to the second embodiment of the present invention; and FIG. 5 is a diagram illustrating the characteristic of the semiconductor devices fabricated by the methods according to the first and second embodiments.

DETAILED DESCRIPTION OF THE PREFERRED EMBODIMENTS

Figure 1A:
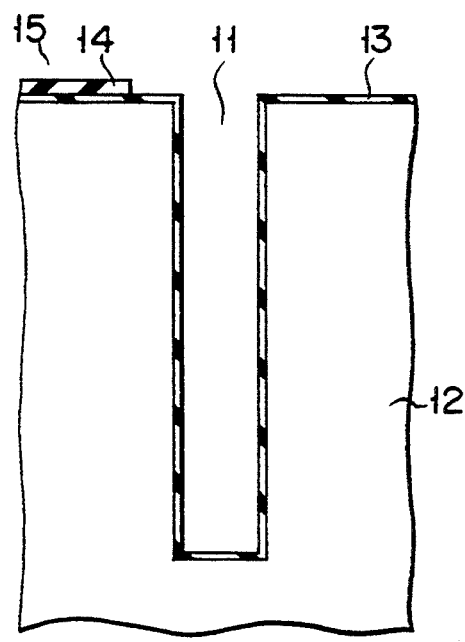
FIGS. 1A and 1B are cross-sectional views of individual steps of a conventional method of fabricating a semiconductor device.
Figure 1B:
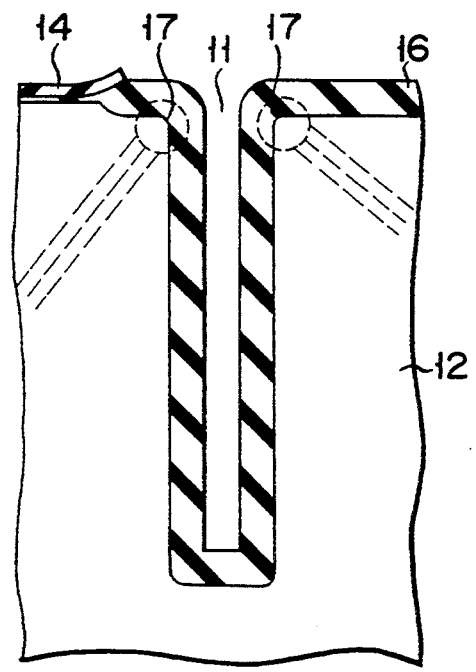

Preferred embodiments of the present invention will now be described referring to the accompanying drawings.

First, a silicon oxide film 21 is formed on the whole surface of a silicon semiconductor substrate 22 by a thermal oxidizing method, and a silicon nitride film 23 is then formed on the oxide film 21, as shown in FIG. 2A. Subsequently, a silicon oxide film 24 is deposited on the silicon nitride film 23 by a CVD (Chemical Vapor Deposition) method, followed by coating of a photoresist on the entire surface of the resultant structure. The photoresist is then subjected to pattern exposure and developing processing, thus forming photoresist mask 25.

Next, by using an isotropic etching method, such as RIE (Reactive Ion Etching), with the mask 25, the silicon oxide film 24 and silicon nitride film 23 are selectively removed. Subsequently, by using an isotropic etching method, such as a wet etching method involving a mixture of a hydrofluric acid and a nitric acid, the underlying substrate 22 is further removed about 0.5 $\mu$m, forming a trench 26 in the substrate 22. It is to be noted that, as the isotropic etching method, a plasma etching method called "CDE (Chemical Dry Etching)" may replace the wet etching method.

Then, by using the isotropic etching method, such as a wet etching method involving a mixture of isopropyl alcohol, KOH and water, with the mask 25, the substrate 22 at the upper portion of the trench 26 is etched, forming a taper portion 27 in the substrate 22, as shown in FIG. 2B.

Figure 2C:
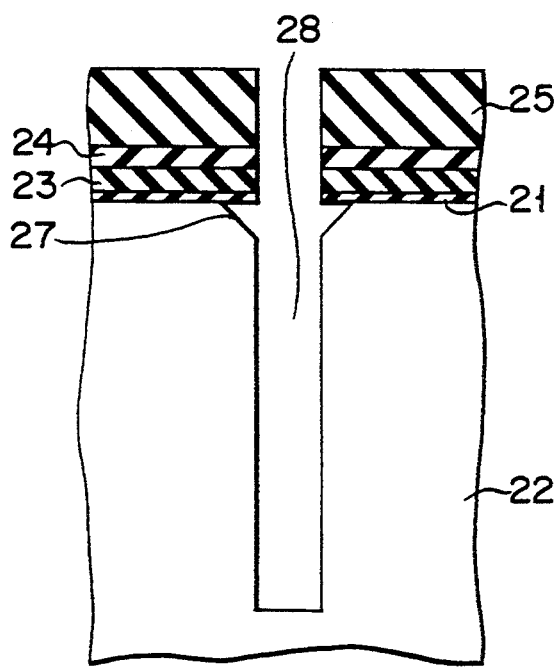

Next, the trench 26 is further etched by anisotropic etching, such as RIE, thereby forming a trench 28, 5 to 7 $\mu$m deep, as shown in FIG. 2C.

Figure 2D:
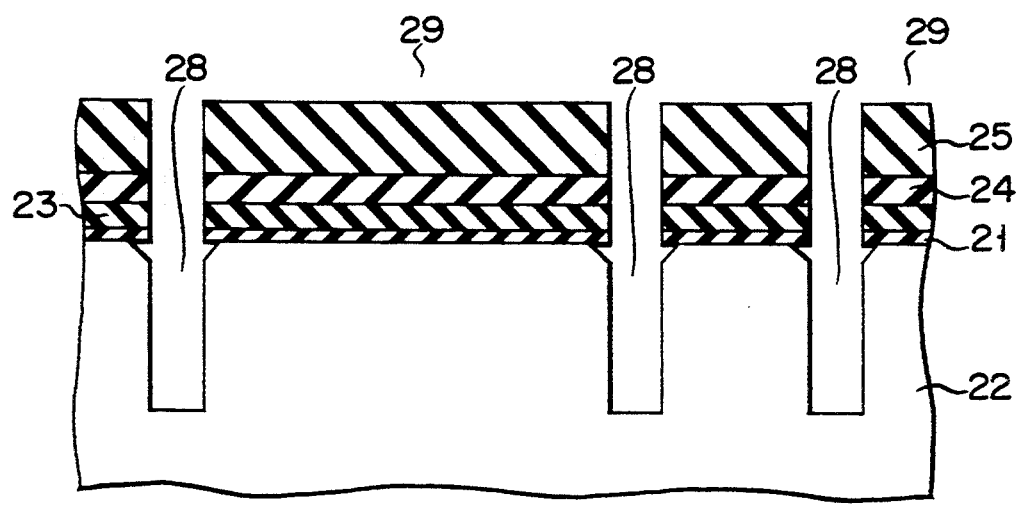

FIG. 2D illustrates multiple trenches 28 formed through the above-described individual steps. These trenches 28 isolate individual device regions 29 from one another.

Then, after the resist mask 25, silicon oxide film 24, silicon nitride film 23 and silicon oxide film 21 are removed, the resultant structure is subjected to thermal oxidization at 950° C. in the environment of a gas mixture of $H_2$ and $O_2$, forming a silicon oxide film 30 having a thickness of about 0.05 $\mu$m on the surface of the semiconductor substrate 22 and the inner wall of the trench 28, as shown in FIG. 2E. Subsequently, a silicon nitride film 31 is deposited 0.05 to 0.15 $\mu$m thick on the entire surface of the resultant structure at 780° C. by a low pressure CVD method. The silicon nitride film 31 is selectively etched to remain on each device region 29 by a plasma etching method. The remaining silicon nitride film 31 is to be used as a nonoxide film in the subsequent step.

Next, as shown in FIG. 2F, by a wet oxidizing method using the nonoxide film (silicon nitride film 31) as an oxidization-resistant mask, a silicon oxide film 32 is formed about 0.8 $\mu$m thick on part of each device region 29 where the silicon nitride film 31 is not formed, and the inner wall of each trench 28. FIG. 2G presents an enlarged illustration of one of the trenches after the above step has been completed.

Then, after the silicon nitride film 31 is removed, polycrystalline silicon 33 is buried in each trench 28 and its surface is flattened, followed by formation of a thin cap oxide film 34 on the trench 28, as shown in FIG. 2H.

Figure 3:
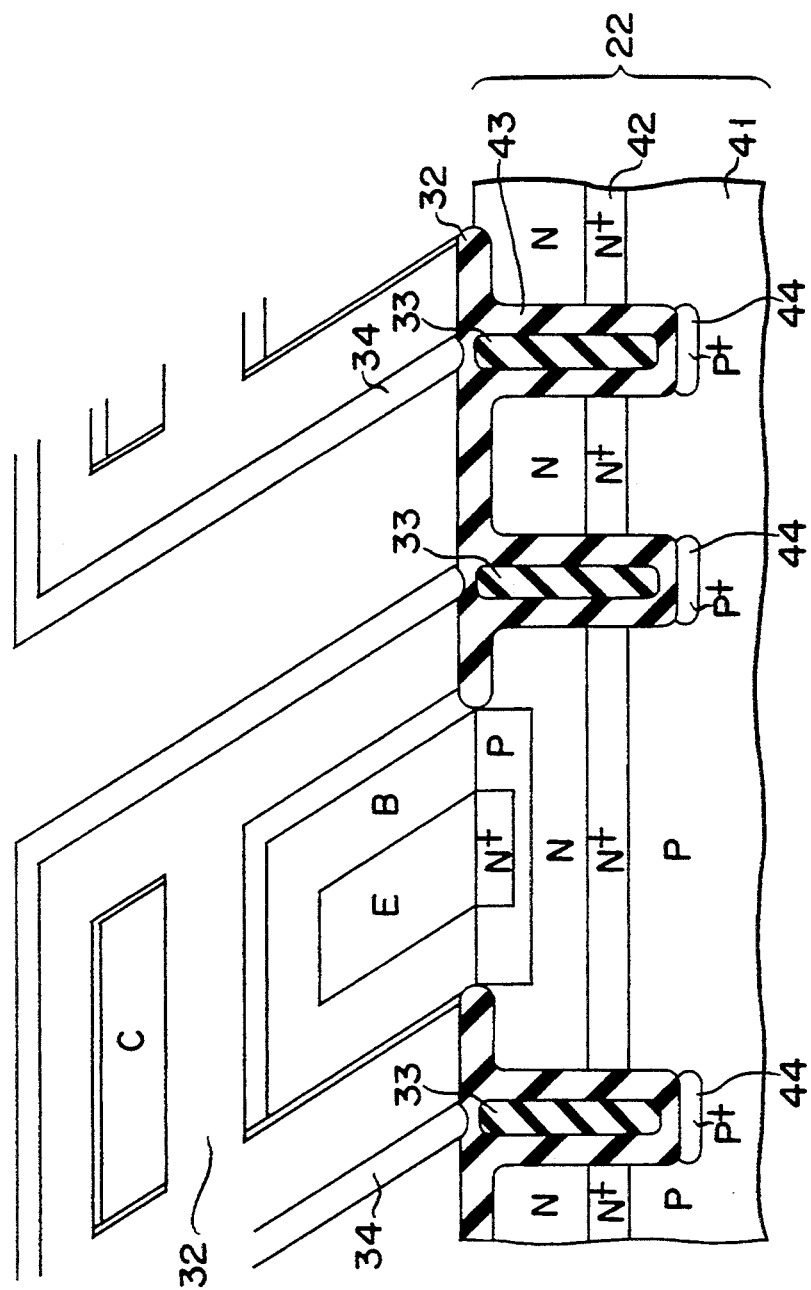
FIG. 3 is a perspective view illustrating the structure of a bipolar transistor fabricated by the method according to the first embodiment.

Thereafter, a bipolar transistor having, for example, an N type emitter region E, a P type base region B and an N type collector region C, is formed in each device region 29 by a known method, as shown in FIG. 3. Referring to FIG. 3, the substrate 22 has a three-layer structure including a P type region 41, an N+ type buried region 42 and an N type epitaxial region 43. It is to be noted that a P+ type region 44 is formed in the bottom of each trench 28 by an ion implantation method or diffusion method before the polycrystalline silicon 33 is buried therein.

According to the method of the first embodiment, the taper portion 27 is formed in the substrate 22 at the upper portion of the trench 28 at the time the step illustrated in FIG. 2B is executed, and the resultant structure is subjected to oxidization in the subsequent step, thereby forming the silicon oxide film 32. In forming the silicon oxide film 32, therefore, an upper corner portion of the trench 28 will be shaped round with some radius of curvature, not square, as shown in FIG. 2G.

It is therefore possible to relax the concentration of thermal stress on the corner portion at the oxidization time, and the concentration of stress originated from expansion of volume or the like thereon. This suppresses the occurrence of dislocation near the corner portion of the trench, which has been a bottleneck in the prior art, thus ensuring improvement of the device isolation characteristic and the characteristic of a device formed in each device region.

A method according to the second embodiment of the present invention will be described below referring to FIGS. 4A to 4E.

First, as in the case illustrated in FIG. 4A, a silicon oxide film 21 is formed on the whole surface of a silicon semiconductor substrate 22 by a thermal oxidizing method, and a silicon nitride film 23 is then formed on the oxide film 21. Subsequently, a silicon oxide film 24 is deposited on the silicon nitride film 23 by a CVD method, followed by coating of a photoresist on the entire surface of the resultant structure. The photoresist is then subjected to pattern exposure and developing processing, thus forming photoresist mask 25. Then, by using an anisotropic etching method, such as RIE, with the mask 25, the silicon oxide film 24, silicon nitride film 23 and silicon oxide film 21 are selectively removed, forming an opening 35.

Next, a trench 28 is formed 5 to 7 $\mu$m deep in the substrate 22 by the RIE using the mask 25, as shown in FIG. 4B. This trench isolates the device regions from each other as in the case shown in FIG. 2D. At the time the etching is performed, a polymer 36 is adhered as a reaction product to the side wall of the trench 28.

Then, as shown in FIG. 4C, the polymer 36 adhered to the side wall of the trench 28 is removed by a wet etching method. At the same time, the entire silicon oxide film 24 is removed. That part of the silicon oxide film 21 which is adjacent to the trench 28 is also removed. Then, the substrate 22 at the upper portion of the trench 28 is etched using the CDE, thereby forming a taper portion 27 in the substrate 22. At the same time, the bottom of the trench 28 is etched, rounding its bottom edge portions.

Then, as shown in FIG. 4D, after the silicon nitride film 23 and silicon oxide film 21 are removed, the resultant structure is subjected to thermal oxidization at 950° C. in the environment of a gas mixture of $H_2$ and $O_2$, forming a silicon oxide film 30 having a thickness of about 0.05 $\mu$m on the surface of the semiconductor substrate 22 and the inner wall of the trench 28, as per the first embodiment. Subsequently, a silicon nitride film 31 is deposited 0.05 to 0.15 $\mu$m thick on the entire surface of the resultant structure at 780° C. by a low pressure CVD method. The silicon nitride film 31 is selectively etched to remain on a device region 29 by a plasma etching method. Then, by a wet oxidizing method using the silicon nitride film 31 as an oxidization-resistant mask, a silicon oxide film 32 is formed 0.8 $\mu$m thick on part of the device region 29 where the silicon nitride film 31 is not formed, and the inner wall of each trench 28. At this time, as illustrated, the upper corner portion of the trench 28 will be shaped round with some radius of curvature, R, not square. The oxidization is executed so that the radius of curvature, R, becomes about 0.1 $\mu$m.

Then, after the silicon nitride film 31 is removed, polycrystalline silicon 33 is buried in the trench 28 and its surface is flattened, followed by formation of a thin cap oxide film 34 on the trench 28, as shown in FIG. 4E.

Thereafter, a bipolar transistor having an emitter region E, a base region B and a collector region C, is formed in each device region 28 by a known method, as shown in FIG. 3, as per the first embodiment.

According to the method of the second embodiment too, the taper portion 27 is formed in the substrate 22 at the upper portion of the trench 28 at the time the step illustrated in FIG. 4C is executed, and the resultant structure is subjected to oxidization in the subsequent step, thereby forming the silicon oxide film 32. In forming the silicon oxide film 32, therefore, the upper corner portion of the trench 28 will be shaped round with a radius of curvature of about 0.1 µm, not square, as shown in FIG. 4D.

In the second embodiment, therefore, it is possible to relax the concentration of thermal stress on the corner portion at the oxidization time, and the concentration of stress originated from expansion of volume or the like thereon. This suppresses the occurrence of dislocation near the corner portion of the trench, which has been a bottleneck in the prior art, thus ensuring improvement of the device isolation characteristic and the characteristic of a device formed in each device region.

FIG. 5 is a characteristic diagram illustrating the relationship between the radius of curvature, R, at the upper corner portion of the trench 28 and the dislocation density when bipolar transistors are formed in the device regions of the semiconductor substrate isolated by the methods of the first and second embodiments. As illustrated, with the radius of curvature, R, set 0.1 µm or larger, the dislocation can be suppressed as compared with the prior art in which R is almost 0. As a result, the device isolation characteristic and the characteristic of devices formed in the device regions can be improved. The radius of curvature, R, at the upper corner portion of the trench 28 is not limited to about 0.1 µm, but can be set larger. It is to be noted that the larger the radius of curvature, R, the greater the effect of suppressing the dislocation.

Additional advantages and modifications will readily occur to those skilled in the art. Therefore, the invention in its broader aspects is not limited to the specific details, representative devices, and illustrated examples shown and described herein. Accordingly, various modifications may be without departing from the spirit or scope of the general inventive concept as defined by the appended claims and their equivalents.

What is claimed is:

1. A semiconductor device comprising:
   a first semiconductor region of a first conductivity type;
   a second semiconductor region of a second conductivity type in said first semiconductor region;
   a third semiconductor region of the second conductivity type in said second semiconductor region and containing impurities whose concentration is lower than that of impurities of said second semiconductor region;
   a device region in said third semiconductor region;
   a device-isolation trench extending through said second semiconductor region and said third semiconductor region, said trench having a bottom portion within said first semiconductor region and surrounding said device region and
   an insulating film having a thickness of about 0.8 µm covering an inner wall of said trench, a surface of said third semiconductor region adjacent to said trench, and a surface of said device region of said third semiconductor region along a side of said trench, an upper corner portion of said trench having a radius of curvature of 0.1 µm or greater.

2. A semiconductor device according to claim 1, further comprising:
   a fourth semiconductor region of the first conductivity type in an upper portion of said third semiconductor region acting as said device region; and
   a fifth semiconductor region of the second conductivity type in an upper portion of said fourth semiconductor region.

3. A semiconductor device according to claim 1, further comprising:
   a sixth semiconductor region of the first conductivity type in said first semiconductor region corresponding to the bottom portion of said trench and containing impurities whose concentration is higher than that of impurities of said first semiconductor region.

4. A semiconductor device comprising:
   a first semiconductor region of a first conductivity type;
   a buried region of a second conductivity type in said first semiconductor region;
   a second semiconductor region of the second conductivity type in said buried region, containing impurities whose concentration is lower than that of impurities of said buried region, and in which a collector of a bipolar transistor is to be formed;
   a device region in said second semiconductor region;
   a device-isolation trench extending through said buried region and said second semiconductor region, said trench having a bottom portion within said first semiconductor region and surrounding said device region;
   a fourth semiconductor region of the first conductivity type in an upper portion of said second semiconductor region acting as said device region and in which a base of a said bipolar transistor is to be formed;
   a fifth semiconductor region of the second conductivity type in an upper portion of said fourth semiconductor region and in which an emitter of said bipolar transistor is to be formed; and
   an insulating film, having a thickness of about 0.8 µm, covering an inner wall of said trench, a surface of said second semiconductor region adjacent to said trench, a surface of said device region of said second semiconductor region along a side of said trench, an upper corner portion of said trench having a radius of curvature of 0.1 µm or greater.

5. A semiconductor device according to claim 4, further comprising:
   a sixth semiconductor region of the first conductivity type in said first semiconductor region corresponding to the bottom portion of said trench and containing impurities whose concentration is higher than that of impurities of said first semiconductor region.

* * * * *